United States Patent
Lixl et al.

(10) Patent No.: US 7,271,521 B2
(45) Date of Patent: Sep. 18, 2007

(54) CIRCUIT HAVING AT LEAST ONE PIEZOELECTRIC ACTUATOR

(75) Inventors: Heinz Lixl, Regensburg (DE); Richard Pirkl, Regensburg (DE)

(73) Assignee: Volkswagen Mechatronic GmbH & Co. KG, Stollberg (DE)

( * ) Notice: Subject to any disclaimer, the term of this patent is extended or adjusted under 35 U.S.C. 154(b) by 150 days.

(21) Appl. No.: 11/107,614

(22) Filed: Apr. 15, 2005

(65) Prior Publication Data

US 2005/0235966 A1     Oct. 27, 2005

Related U.S. Application Data

(63) Continuation of application No. PCT/DE03/03089, filed on Sep. 17, 2003.

(30) Foreign Application Priority Data

Oct. 16, 2002   (DE) .................. 102 48 214

(51) Int. Cl.
*H01L 41/09* (2006.01)
(52) U.S. Cl. ............................ 310/317
(58) Field of Classification Search ............ 310/317, 310/318, 328
See application file for complete search history.

(56) References Cited

U.S. PATENT DOCUMENTS

| | | | |
|---|---|---|---|
| 4,767,959 A | 8/1988 | Sakakibara et al. | 310/317 |
| 4,834,203 A | 5/1989 | Takahashi et al. | 180/79.1 |
| 4,939,653 A | 7/1990 | Tsurumiya et al. | 364/424.05 |
| 4,961,476 A | 10/1990 | Witte et al. | 180/197 |
| 5,057,734 A | 10/1991 | Tsuzuki et al. | 310/317 |
| 5,184,297 A | 2/1993 | Graber et al. | 364/424.05 |
| 5,392,214 A | 2/1995 | Momose et al. | 364/424.05 |
| 5,440,487 A | 8/1995 | Althoff et al. | 364/424.05 |
| 6,041,884 A | 3/2000 | Shimizu et al. | 180/443 |
| 7,019,436 B2 * | 3/2006 | Rueger et al. | 310/316.03 |
| 2002/0011762 A1 | 1/2002 | Klenk et al. | 310/316.03 |

FOREIGN PATENT DOCUMENTS

| | | |
|---|---|---|
| DE | 3811214 | 4/1988 |
| DE | 3822171 | 6/1988 |
| DE | 3825885 | 7/1988 |
| DE | 4134850 | 10/1991 |

(Continued)

OTHER PUBLICATIONS

Machine translation of DE 19905340.*

*Primary Examiner*—Derek J Rosenau
(74) *Attorney, Agent, or Firm*—Baker Botts L.L.P.

(57) ABSTRACT

When a drive command (S*) is input by a control circuit (3), a drive signal (S) can be emitted to a piezoelectric actuator (Pi) by a drive circuit (1), with the result that the piezoelectric actuator (Pi) is changed over from a zero position to a drive position. When a correction command (I1*, I2*) is input by the control circuit (3), a correction signal (I1, I2) can be emitted to the piezoelectric actuator (Pi) by a correction circuit (2), with the result that the piezoelectric actuator (Pi) is changed over from the zero position to a correction position. The input of the drive command (S*) and the input of the correction command (I1*, I2*) are interlocked with respect to one another.

20 Claims, 2 Drawing Sheets

FOREIGN PATENT DOCUMENTS

| | | |
|---|---|---|
| DE | 4136338 | 11/1991 |
| DE | 69217538 | 12/1992 |
| DE | 4332040 | 9/1993 |
| DE | 19539088 | 10/1995 |
| DE | 19841710 | 9/1998 |
| DE | 19827170 | 12/1999 |
| DE | 19905340 | 8/2000 |
| DE | 10012607 | 9/2001 |

\* cited by examiner

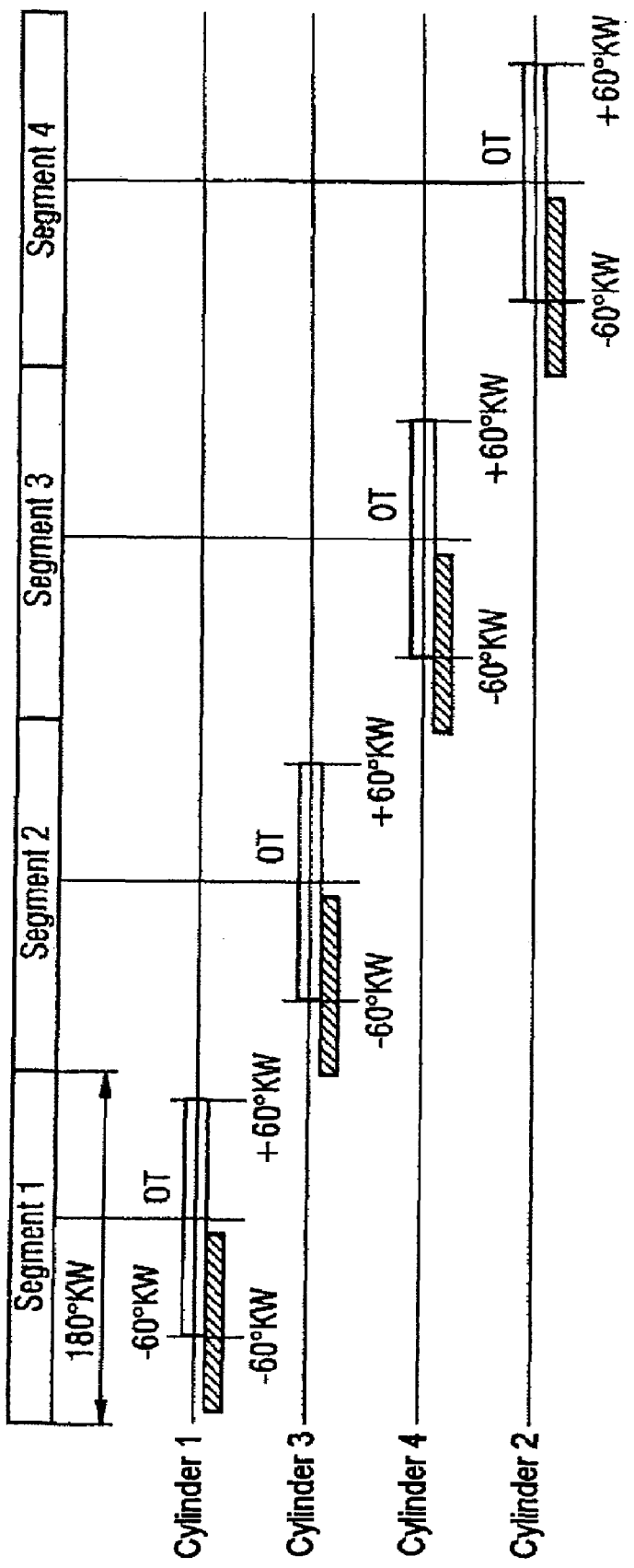

CIRCUIT HAVING AT LEAST ONE PIEZOELECTRIC ACTUATOR

CROSS REFERENCE TO RELATED APPLICATION

This application is a continuation of copending International Application No. PCT/DE03/03089 filed Sep. 17, 2003 which designates the United States, and claims priority to German application no. 102 48 214.4 filed Oct. 16, 2002.

TECHNICAL FIELD OF THE INVENTION

The present invention relates to a circuit having at least one piezoelectric actuator, a drive circuit, a correction circuit and a control circuit.

DESCRIPTION OF THE RELATED ART

Such a circuit is known, for example, from DE 199 05 340 C2. The circuit described there already functions in a satisfactory manner. However, it has a comparatively complex design, since, with this circuit, additive superimposition of the drive signal and the correction signal is required. In the process, the changeover to the correction position primarily serves the purpose of achieving a defined rest position of the piezoelectric actuator during the drive intervals.

U.S. Pat. No. 4,767,959 describes a method and an apparatus for driving a capacitive load, in particular a piezoelectric actuator. In particular, the generation of a preinjection signal and a main injection signal for the purpose of generating a preinjection and a main injection is described.

DE 199 05 340 C2 describes a method and an arrangement for presetting and dynamically adjusting piezoelectric actuators. The electric drive voltage of the actuator for dynamic deflection purposes is superimposed by a controllable DC voltage component which is independent thereof. The dynamic, pulsed excitation voltage and the DC voltage are superimposed in a summation circuit to form a voltage which is applied to the piezoelectric actuator.

DE 198 27 170 A1 describes a method and an apparatus for controlling a piezoelectric element to a desirable extent. It envisages a plurality of piezoelectric elements which can be driven independently of one another by means of selection switches.

DE 100 12 607 C2 describes a method for driving a capacitive actuator, in particular a piezoelectrically operated fuel injection valve of an internal combustion engine. An idling stroke of the piezoelectric actuator is compensated for by supplying a charge.

SUMMARY OF THE INVENTION

The object of the present invention consists in developing a generic circuit such that, with it, it is possible to achieve essentially the same result with less complexity.

The object is achieved by the control circuit being designed such that the input of the drive command and the input of the correction command are interlocked with respect to one another.

The present invention is thus based on the knowledge that, for many applications, the travel caused by the drive signal in relation to the correction position is of secondary importance. It is more important, rather, that the correction position is assumed when the piezoelectric actuator is in the non-drive state. This is also achieved in the case of the refinement according to the invention. The refinement according to the invention makes it possible, on the other hand, to dispense with a superimposition stage in which the drive signal and the correction signal are added.

It is possible for the correction circuit to have a first and a second sub-circuit, for the control circuit to be designed such that the correction command can be emitted either to the first or to the second sub-circuit, for the first sub-circuit to be designed and arranged such that, when the correction command is input to the first sub-circuit, the correction position lies between the zero position and the drive position, and for the second sub-circuit to be designed and arranged such that, when the correction command is input to the second sub-circuit, the zero position lies between the correction position and the drive position. In this case, it is possible to set the correction position in relation to the zero position in both directions.

Alternatively, it is also possible for the correction circuit to be designed and arranged such that the correction position always lies between the zero position and the drive position or such that the zero position always lies between the correction position and the drive position. In particular in the latter case, a technically simple correction circuit results which has highly adequate efficiency. This is because a deflection in the direction of the drive position is generally not required.

The correction circuit may be in the form of open-loop correction signal control and/or closed-loop correction signal control, depending on whether the correction signal is fed back to the correction circuit or not. The changeover between open-loop control and closed-loop control of the correction signal may take place in this case in dependence on the operating state. The changeover is preferably subject to hysteresis.

If the control circuit has a position signal supplied to it, with the aid of which a desired position can be determined by the control circuit, and the control circuit is designed such that, with the aid of the desired position, a corresponding correction command can be determined by it, the circuit functions particularly well. This is particularly the case when the position signal is a signal which is derived from the changeover of the piezoelectric actuator to the drive position. This is because in this case the correction position is set in regulated fashion.

If the correction circuit is designed such that the correction signal is limited by it to a limit value at which no depolarization of the piezoelectric actuator takes place, the piezoelectric actuator has a particularly long life. A reliable, stable switching behavior is thus ensured for a long period of time. The limit value may be, for example, 30 volt or less.

The drive circuit and the correction circuit can generally be connected to a DC voltage system. In this case, an advantageous refinement of the circuit is produced by it having a voltage transformer which is arranged between the DC voltage system on the one hand and the drive circuit and the correction circuit on the other hand.

If the circuit has a plurality of piezoelectric actuators, it preferably has a switching device which can be driven by the control circuit, with the result that it is possible to control to which of the piezoelectric actuators the drive signal is emitted. This is because in this case minimum circuitry complexity results.

The circuitry complexity may be reduced further still if it is also possible to control, by means of the switching device, to which of the piezoelectric actuators the correction signal is emitted.

A common application of the circuit according to the invention consists in the control of the injection in the case of an internal combustion engine.

BRIEF DESCRIPTION OF THE DRAWINGS

Further advantages and details are given in the description below of an exemplary embodiment in connection with the drawings, in which:

FIG. 2 shows a schematic illustration of a control diagram.

DETAILED DESCRIPTION OF THE PREFERRED EMBODIMENTS

Figure 1:
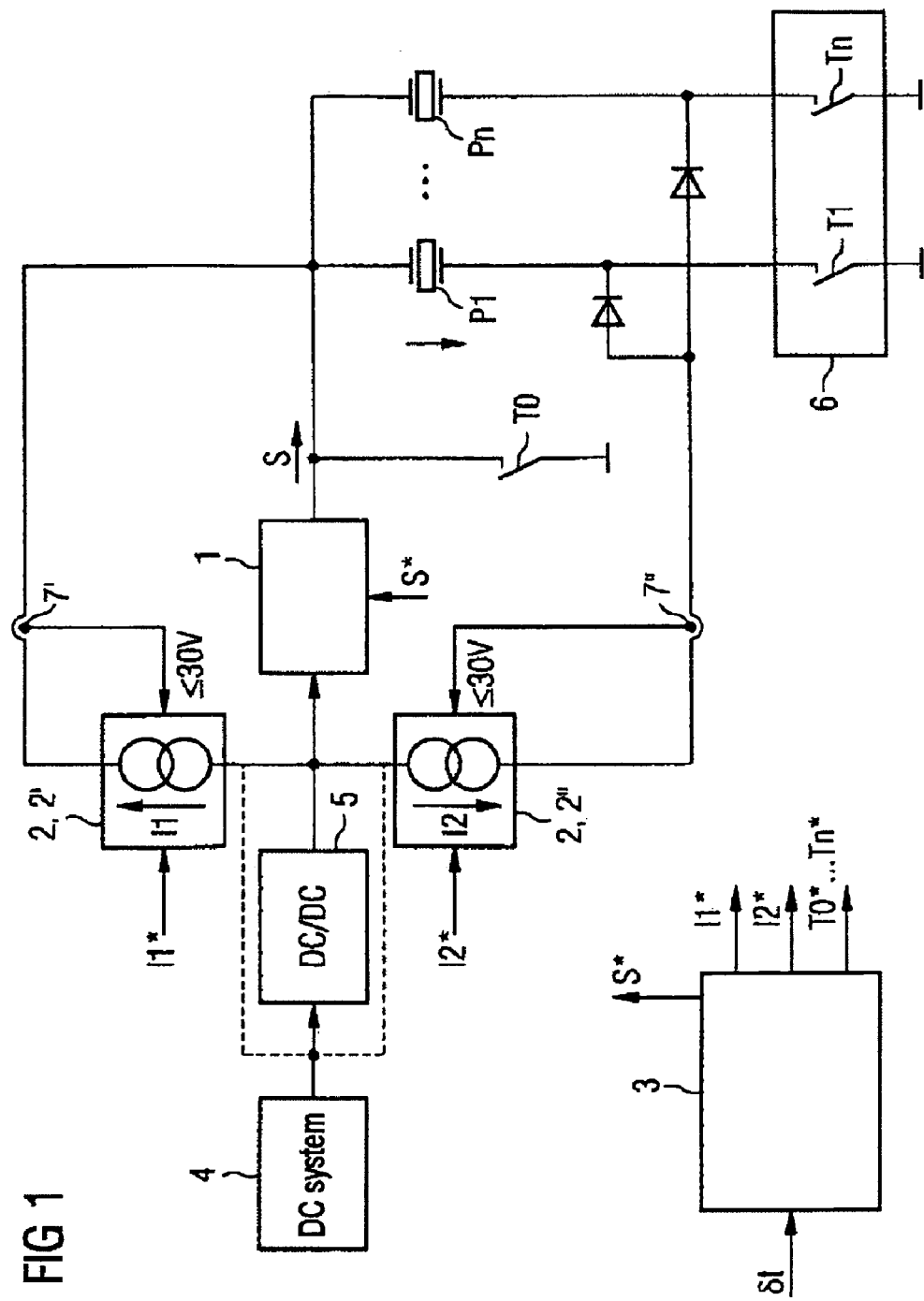
FIG. 1 shows a schematic illustration of a block circuit diagram of a circuit having a plurality of piezoelectric actuators.

In accordance with FIG. 1, a circuit has a plurality of piezoelectric actuators P1 to Pn. It also has a drive circuit 1, a correction circuit 2 and a control circuit 3. The correction circuit 2 has a first sub-circuit 2' and a second sub-circuit 2".

The drive circuit 1 and the correction circuit 2 can be connected to a DC voltage system 4. The circuit may in this case optionally have a voltage transformer 5, which is arranged between the DC voltage system 4 on one side and the drive circuit 1 and the correction circuit 2 on the other side. The voltage transformer 5 is typically in the form of a switched mode power supply 5. It converts the system voltage to a higher voltage.

The circuit shown in FIG. 1 is generally used for the purpose of controlling the injection in the case of an internal combustion engine. The system voltage of the DC voltage system 4 is therefore generally 12 or 24 volt. The output voltage of the voltage transformer 5 is generally greater than the system voltage. It is, for example, in the range between 60 and 100 volt.

The control circuit 3 is also generally supplied with energy from the DC voltage system 4. This is not illustrated in FIG. 1 merely for reasons of clarity.

The control circuit 3 emits different control signals. Firstly, these are a drive command S* which can be input to the drive circuit 1. In addition, these signals are correction commands I1*, I2* which can be input to the first and second sub-circuit 2', 2", respectively. Finally, they are switching commands T0* to Tn* which can be input to corresponding switches T0 to Tn of a switching device 6.

If the drive command S* is input to the drive circuit 1 by the control circuit 3, a drive signal S is emitted to one of the piezoelectric actuators P1 to Pn by the drive circuit 1. At the same time, a switching command Ti* is emitted to one of the switches T0 to Tn by the control circuit 3. The switching device 6 can thus be driven by the control circuit 3. The driving of one of the switches T0 to Tn controls to which of the piezoelectric actuators P1 to Pn the drive signal S is emitted. The driven piezoelectric actuator Pi is changed over from a zero position to a drive position on the basis of the drive signal S. In this case, the zero position corresponds to the position of the piezoelectric actuator Pi which it assumes in the no-load state (applied voltage=0 V, flowing current=0 A).

The driving of the piezoelectric actuators P1 to Pn is illustrated by way of example in FIG. 2 for a four-cylinder, four-position engine. The abbreviation "KW" in this case represents the crankshaft, the abbreviation "OT" represents the upper dead center. The boxes which are not filled out in FIG. 2 mean the angular range within which injection into one of the cylinders of the engine can take place. Injection, based on the respective cylinder, can take place within the range from 60° before the upper dead center to 60° after the upper dead center, as is shown.

If a correction command I1* and I2*, respectively, is input to the first and second sub-circuit 2', 2", respectively, by the control circuit 3, a correction signal I1 and I2, respectively, is emitted to the piezoelectric actuators P1 to Pn by the driven sub-circuit 2', 2".

The control circuit 3 is designed such that it emits a correction command I1*, I2* either to the first or to the second sub-circuit 2', 2". At no point in time, therefore, is a correction command I1*, I2* emitted to both of the sub-circuits 2', 2".

When the correction command I1* is input to the first sub-circuit 2', at the same time one of the switches T1 to Tn is driven by a corresponding switching command Ti*. As a result, the switching device 6 controls to which of the piezoelectric actuators P1 to Pn the correction signal I1 is emitted. As a result of this correction signal I1, the driven piezoelectric actuator Pi is changed over from the zero position to a correction position which lies between the zero position and the drive position.

If the correction command I2* is emitted by the control circuit 3 to the second sub-circuit 2", a correction signal I2 is emitted by said sub-circuit 2". In this case, the switches T1 to Tn are not driven. On the other hand, the switch T0 is closed by the control circuit 3. As a result, all of the piezoelectric actuators P1 to Pn are driven in the same way. In this case, there is a negative deflection of the piezoelectric actuators P1 to Pn. The zero position thus lies in this case between the correction position and the drive position of the piezoelectric actuators P1 to Pn.

As can be seen in FIG. 2, the regions within which a correction command I1*, I2* can be input to the correction circuit 2 begin at approximately 80° before the upper dead center with respect to each cylinder. The regions (illustrated hatched in FIG. 2) extend up to shortly before the upper dead center of the respective cylinder. They generally end at the latest 10° before the upper dead center. In each case, however, the control circuit 3 ensures that the drive command S* is input only when the input of the correction command I1* or I2* is ended. The control circuit 3 is thus designed such that the input of the drive command S* and the input of the correction command I1* or I2* are interlocked with respect to one another.

In accordance with FIG. 1, the correction signals I1, I2, which are emitted by the sub-circuits 2', 2", are detected at the measurement points 7', 7" and again passed to the sub-circuits 2', 2". Said sub-circuits 2', 2" are thus in the form of closed-loop correction signal control circuits, since they can correct the emitted correction signal I1 and I2, respectively, until it assumes the desired value for the correction command I1*, I2*. The measurement points 7', 7", however, could also be dispensed with. In this case, the sub-circuits 2', 2" would be in the form of open-loop correction signal control circuits.

It is also possible to measure, directly or indirectly, a position signal δt which is characteristic of an optimum correction position. For example, a time difference δt can be detected which elapses between the beginning of the output of the drive command S* and the actual placement of the driven piezoelectric actuator Pi on a plunger to be actuated. This time difference δt is characteristic of the distance of the zero position from the plunger. The time difference δt is thus a signal which is derived from the changeover of the piezoelectric actuator Pi to the drive position.

With the aid of the position signal δt, it is possible for a desired position for the piezoelectric actuators P1 to Pn to be determined by the control circuit 3. The control circuit 3 can thus be designed such that, with the aid of the position signal, the desired position and, with the aid of the desired position, the corresponding correction command I1* or I2* can be determined by it.

In accordance with FIG. 1, both the correction signal I1 and the correction signal I2 are limited by the sub-circuits 2', 2" to a limit value which is smaller than or at most equal to 30 volt. This design for the correction signals I1, I2 ensures that no depolarization of the respective driven piezoelectric actuator Pi takes place by means of the correction signals I1, I2.

In the embodiment in accordance with FIG. 1, the correction circuit 2 has two sub-circuits 2', 2". However, one of the two sub-circuits 2', 2" could also be dispensed with. Which of the two sub-circuits 2', 2" can be dispensed with is in this case a question of the design of the piezoelectric actuators P1 to Pn and the other mechanical characteristics of the system.

By means of the present invention, it is possible, in particular in the application of the control of the injection in the case of an internal combustion engine, in particular in the case of pump/nozzle systems, to prevent in a simple manner an undesirable autoinjection during the injection intervals of the individual cylinders. In addition, starting problems owing to insufficient buildup of pressure can be prevented owing to the avoidance of a servo-valve "remaining open".

We claim:

1. A circuit comprising:
   at least one piezoelectric actuator assuming a zero position in the no-load state,
   a control circuit,
   a drive circuit for generating a drive signal to be emitted to the piezoelectric actuator when a drive command is input by the control circuit, wherein on the basis of said drive signal it is possible for the piezoelectric actuator to be changed over from the zero position to a drive position, and
   a correction circuit for generating a correction signal to be emitted to the piezoelectric actuator when a correction command is input by the control circuit, wherein on the basis of said correction signal it is possible for the piezoelectric actuator to be changed over from the zero position to a correction position,
   wherein the control circuit is designed such that the input of the drive command and the input of the correction command are interlocked with respect to one another.

2. The circuit as claimed in claim 1, wherein
   the correction circuit has a first and a second sub-circuit,
   the control circuit is designed such that the correction command can be emitted either to the first or to the second sub-circuit,
   the first sub-circuit is designed and arranged such that, when the correction command is input to the first sub-circuit, the correction position lies between the zero position and the drive position, and
   the second sub-circuit is designed and arranged such that, when the correction command is input to the second sub-circuit, the zero position lies between the correction position and the drive position.

3. The circuit as claimed in claim 1, wherein the correction circuit is designed and arranged such that the correction position always lies between the zero position and the drive position.

4. The circuit as claimed in claim 1, wherein the correction circuit is designed and arranged such that the zero position always lies between the correction position and the drive position.

5. The circuit as claimed in claim 1, wherein the correction circuit is in the form of open-loop correction signal control or closed-loop correction signal control.

6. The circuit as claimed in claim 1, wherein the control circuit may have a position signal supplied to it, with the aid of which a desired position can be determined by the control circuit, and the control circuit is designed such that, with the aid of the desired position, the corresponding correction command can be determined by it.

7. The circuit as claimed in claim 1, wherein the position signal is a signal which is derived from the changeover of the piezoelectric actuator to the drive position.

8. The circuit as claimed in claim 1, wherein the correction circuit is designed such that the correction signal is limited by it to a limit value at which no depolarization of the piezoelectric actuator takes place.

9. The circuit as claimed in claim 8, wherein the limit value is less than or at most equal to 30 volt.

10. The circuit as claimed in claim 1, wherein the drive circuit and the correction circuit can be connected to a DC voltage system.

11. The circuit as claimed in claim 10, wherein it has a voltage transformer which is arranged between the DC voltage system on the one hand and the drive circuit and the correction circuit on the other hand.

12. The circuit as claimed in claim 1, wherein it has a plurality of piezoelectric actuators and a switching device which can be driven by the control circuit, with the result that it is possible to control to which of the piezoelectric actuators the drive signal is emitted.

13. The circuit as claimed in claim 12, wherein it is also possible to control, by means of the switching device, to which of the piezoelectric actuators the correction signal is emitted.

14. The circuit as claimed in claim 1, wherein it is used for the purpose of controlling the injection in the case of an internal combustion engine.

15. A method of operating at least one piezoelectric actuator which assumes a zero position in the no-load state, comprising the steps of:
   generating a drive signal to be emitted to the piezoelectric actuator when a drive command is input by a control circuit, wherein on the basis of said drive signal it is possible for the piezoelectric actuator to be changed over from the zero position to a drive position, and
   generating a correction signal to be emitted to the piezoelectric actuator when a correction command is input by the control circuit, wherein on the basis of said correction signal it is possible for the piezoelectric actuator to be changed over from the zero position to a correction position,
   wherein the input of the drive command and the input of the correction command are interlocked with respect to one another.

16. The method as claimed in claim 15, wherein the correction position always lies between the zero position and the drive position.

17. The method as claimed in claim 15, wherein the zero position always lies between the correction position and the drive position.

18. The method as claimed in claim 15, further comprising the steps of: supplying a position signal supplied to the control circuit, with the aid of which a desired position can be determined by the control circuit, and with the aid of the desired position, the corresponding correction command can be determined.

19. The method as claimed in claim 15, wherein the position signal is a signal which is derived from the changeover of the piezoelectric actuator to the drive position.

20. The method as claimed in claim 15, wherein the correction signal is limited to a limit value at which no depolarization of the piezoelectric actuator takes place.

* * * * *